US007739633B2

(12) United States Patent
Ahmad et al.

(10) Patent No.: US 7,739,633 B2
(45) Date of Patent: Jun. 15, 2010

(54) VERIFICATION OF HIGHLY OPTIMIZED SYNCHRONOUS PIPELINES VIA RANDOM SIMULATION DRIVEN BY CRITICAL RESOURCE SCHEDULING SYSTEM AND PROGRAM PRODUCT

(75) Inventors: Faisal A. Ahmad, Albany, NY (US); Kevin C. Gower, LaGrangeville, NY (US); Anish T. Patel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 12/043,209

(22) Filed: Mar. 6, 2008

(65) Prior Publication Data
US 2009/0132221 A1 May 21, 2009

Related U.S. Application Data

(62) Division of application No. 10/842,085, filed on May 10, 2004, now Pat. No. 7,426,704.

(51) Int. Cl.
*G06F 17/50* (2006.01)
(52) U.S. Cl. ............... 716/4; 716/1; 716/5; 716/6; 703/14; 703/15; 703/22
(58) Field of Classification Search ............... 716/1–6; 703/14, 15, 22; 714/12, 29, 41, 733
See application file for complete search history.

(56) References Cited

U.S. PATENT DOCUMENTS 5,745,386 A    4/1998   Wile et al.
6,327,559 B1   12/2001  Wile
6,453,450 B1   9/2002   Walter
2009/0144679 A1 *  6/2009   Patel et al. ............... 716/5

OTHER PUBLICATIONS

Ranaweera et al.; "Scheduling of periodic time critical applications for pipelined execution on heterogeneous systems"; Sep. 3-7, 2001; Parallel Processing, International Conference on, 2001; pp. 131-138.*
P. Fay, E. Cerny, P. Pownall, "Improved Design Verification by Random Simulation Guided by Genetic Algorithms" (May 25, 2000).
Jorg Walter, Jena Leenstra, Gerhard Dottling, Bernd Leppla, Hans-Jurgen Muster, Kevin Karke, Bruce Wile, "Hierarchical Random Simulation Approach for the Verification of S/390 CMOS Multiprocessors" (1997).

* cited by examiner

*Primary Examiner*—Helen Rossoshek
(74) *Attorney, Agent, or Firm*—Lynn Augspurger; John E. Campbell

(57) ABSTRACT

Testing a model of a logic circuit model. The testing includes generating valid random input stimulus sequences for a logic circuit model. Enumerating critical resource requirements, enumerating critical resource availabilities does this, and selecting of stimulus sequences and determining legal times for execution of said stimulus sequences based on resource availability. This includes generating a plurality of possible combinations of input stimulus sequences and generating an array representation of critical resource requirements. These are used to generate an array representation of critical resources availabilities.

4 Claims, 3 Drawing Sheets

VERIFICATION OF HIGHLY OPTIMIZED SYNCHRONOUS PIPELINES VIA RANDOM SIMULATION DRIVEN BY CRITICAL RESOURCE SCHEDULING SYSTEM AND PROGRAM PRODUCT

CROSS REFERENCE TO RELATED APPLICATIONS

This application is a division of U.S. application Ser. No. 10/842,085, filed May 10, 2004 now U.S. Pat. No. 7,426,704, entitled "IMPROVED DESIGN VERIFICATION OF HIGHLY OPTIMIZED SYNCHRONOUS PIPELINES VIA RANDOM SIMULATION DRIVEN BY CRITICAL RESOURCE SCHEDULING"

BACKGROUND OF THE INVENTION

1. Field of the Invention

The present invention is directed to providing valid random input sequences to be applied to integrated circuit chips and chip systems to test functional logic circuitry of the chip or in the system. The present invention provides a coding method for guiding simulation of highly optimized pipelines in Memory Control Units, I/O Adapters, Processor Interconnect Units, etc.

2. Description of Background

Previously, random input sequences were used for guiding the simulation of highly optimized pipelines. However, random input sequences failed to effectively provide coverage of unique window and corner conditions. Subsequent quasi-random, biased approaches utilized optimization criteria that increased coverage only linearly and were not exhaustive.

Formal approaches required extensive assertion coding for state-space exploration and were limited in scope to extremely small circuits. Thus, a clear need exists to eliminate the ineffective sequences that are generated using biased random techniques, while also avoiding the cost and size limitations of formal approaches.

SUMMARY OF THE INVENTION

The shortcomings of the prior art are overcome and additional advantages are provided through the provision of critical resource scheduling to optimize the distribution of our valid random inputs to the model. Our invention eliminates the ineffective sequences that are generated using biased random techniques and also avoids avoid the cost and size limitations of formal approaches. Critical resources are monitored to bias the random input stream such that maximum utilization of all functional units within the pipeline occurs without overflow. Delay associated with pipeline stall is thus averted.

A method, system, and program product for generating valid random input stimulus sequences for a logic circuit model. This is done by enumerating critical resource requirements, enumerating critical resource availabilities, selecting of stimulus sequences and determining legal times for execution of said stimulus sequences based on resource availability. This includes generating a plurality of possible combinations of input stimulus sequences and generating an array representation of critical resource requirements. These are used to generate an array representation of critical resources availabilities.

For example, this may be accomplished by generating an array representation of critical resource requirements, generating an array representation of critical resources availabilities, and utilizing these array representations to generate a plurality of possible combinations of input stimulus sequences. The input stimulus sequences are then used to apply an input stimulus sequence to the logic circuit model.

In one example of our invention the input sequence is weighted and this weighting is used to generate an input sequences having a biased probability distribution. This biasing is used to statistically bias input sequence execution times.

Another example of the invention includes generating a parameterized representation of model resources for customizing critical resource usage information for a given stimulus according to configuration data.

A still further example of the invention includes generating valid random input stimulus sequences for a logic circuit model and testing the circuit model, initializing the logic circuit model, calculating resource usage, and selected a command. Next the resource usage of the selected command is parsed, and a determination of the available times to issue the selected command is made. The method, system, and program product of the invention proceeds to a next command and determines the available times to issue the command. The next step is parsing resource availability of the command for an available time to execute the command. If there is no available time, the command is paused and resent. If, however, there is an available time, an optimal window is selected within which to send the command, and the command is scheduled, executed and a next command is selected if a next command exists, otherwise the method exits.

Initializing the logic circuit model includes one of choosing the DIMM technology, choosing the burst mode, choosing the data flow mode, choosing latency setting, and initializing the hardware model of the logic circuit.

Calculating resource usage information includes generating an array representation of critical resource requirements, generating an array representation of critical resources availabilities; and generating a plurality of possible combinations of input stimulus sequences. The resulting input stimulus sequence is applied to the logic circuit model.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
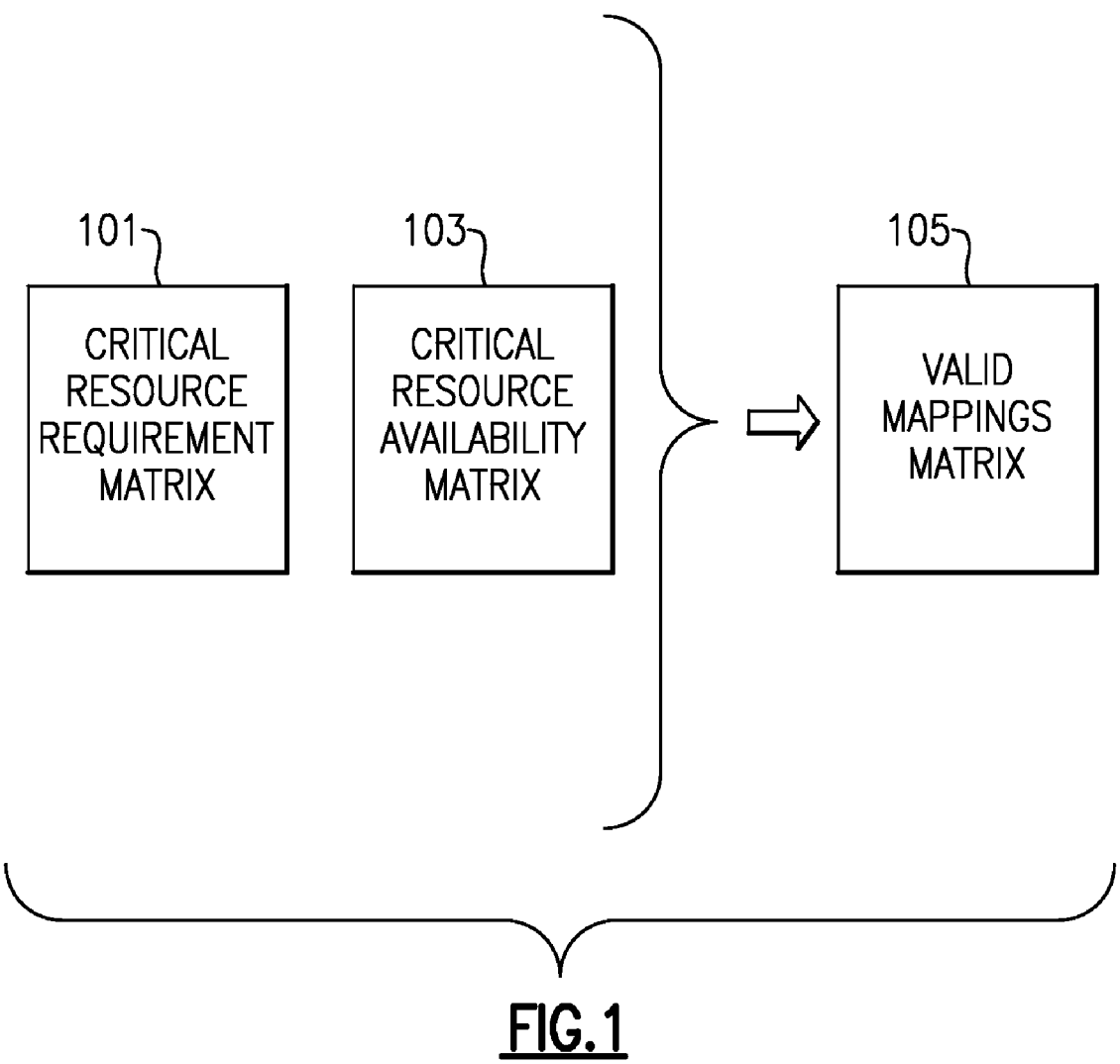
FIG. 1 is a simplified view of a critical resource requirement matrix crossed with a critical resource availability matrix to yield a valid mappings matrix.

Described herein is a method, system, and program product for the verification of memory control units, I/O adapters, processor interconnect units, etc. as found in multiprocessor computer systems. The multiprocessor computer systems use critical resources scheduling to bias a sequence of random inputs to a model. Critical resource scheduling that provides effective and efficient verification of command and data pipelining drives the system of random simulation described herein.

A method, system, and program product for generating valid random input stimulus sequences for a logic circuit model. This is done by enumerating critical resource requirements, enumerating critical resource availabilities, selecting of stimulus sequences and determining legal times for execution of said stimulus sequences based on resource availability. This includes generating a plurality of possible combinations of input stimulus sequences and generating an array representation of critical resource requirements. These are used to generate an array representation of critical resources availabilities.

For example, this may be accomplished by generating an array representation of critical resource requirements, generating an array representation of critical resources availabilities, and utilizing these array representations to generate a plurality of possible combinations of input stimulus sequences. The input stimulus sequences are then used to apply an input stimulus sequence to the logic circuit model.

In one example of our invention the input sequence is weighted and this weighting is used to generate an input sequences having a biased probability distribution. This biasing is used to statistically bias input sequence execution times.

Another example of the invention includes generating a parameterized representation of model resources for customizing critical resource usage information for a given stimulus according to configuration data.

A still further example of the invention includes generating valid random input stimulus sequences for a logic circuit model and testing the circuit model, initializing the logic circuit model, calculating resource usage, and selected a command. Next the resource usage of the selected command is parsed, and a determination of the available times to issue the selected command is made. The method, system, and program product of the invention proceeds to a next command and determines the available times to issue the command. The next step is parsing resource availability of the command for an available time to execute the command. If there is no available time, the command is paused and resent. If, however, there is an available time, an optimal window is selected within which to send the command, and the command is scheduled, executed and a next command is selected if a next command exists, otherwise the method exits. Initializing the logic circuit model includes one of choosing the DIMM technology, choosing the burst mode, choosing the data flow mode, choosing latency setting, and initializing the hardware model of the logic circuit.

Calculating resource usage information includes generating an array representation of critical resource requirements, generating an array representation of critical resources availabilities; and generating a plurality of possible combinations of input stimulus sequences. The resulting input stimulus sequence is applied to the logic circuit model.

As shown in FIG. 1, the method of simulation begins by creating and monitoring a matrix of critical resource usage requirements 101 and availabilities 103 of the model under test. This is done by creating two arrays of each critical resource, each of a fixed length representing the window within which commands may be received. Each array element represents one simulation cycle. A resource's requirement array 101 is populated according to its predefined usage characteristics. As each member of a sequence of random inputs is selected, the critical resource usage and availabilities 103 are compared, and a list of available windows within which the inputs would be legal is determined. This is found via a cycle by cycle comparison of the availability arrays 101 and the input stimulus usage requirements arrays 103. We then obtain the optimal window 105 within which to insert the command in the input sequence timeline based on a statistical algorithm. The availability arrays 103 of all resources to be used are then updated to reflect the new input stimulus. The end result is a series of randomly determined highly optimized pipeline flush cases that eliminate typical pipeline stall delays and replicate highly sophisticated traffic situations.

The method, system, and program product utilizes critical resource scheduling to optimize the distribution of random inputs to the model. Critical resources are monitored to bias the random input stream such that maximum utilization of all functional units within the pipeline occurs without overflow. Delay associated with pipeline stall is thus averted. Metrics on critical resource usage provides data that ensure exhaustive coverage of all target window and corner conditions on any given non-deterministic model of the use environment.

Critical resource scheduling biases a sequence of random inputs to a model. The random simulation driven by critical resource scheduling provides an effective and efficient verification of command and data pipelining in any electronic integrated circuit chip.

The method of simulation begins by creating and monitoring a matrix of critical resource usages in the test model. As each member of a sequence of random inputs is selected, the critical resource usages and availabilities are compared, and a list of available windows within which the input would be legal is determined. This is found via a cycle by cycle comparison of the availability matrix 103 and the input stimulus usage requirements matrix 101, where FIG. 1 illustrates the critical resource requirement matrix 101 crossed with the critical resource availability matrix 103 to yield a valid mappings matrix 105.

Next the optimal window 105 is obtained to insert the command in the input sequence timeline based on a statistical algorithm. The end result is a series of randomly determined highly optimized pipeline flush cases that eliminate typical pipeline stall delays and replicate highly sophisticated traffic situations.

By utilizing the method, system, and program product, a driver implementation of a resource scheduling algorithm picks a uniquely optimal "command window" within which the randomly chosen command is inserted. When iterated, the implementation would provide maximal simulation coverage of all targeted functional units, with exponentially greater efficiency than traditional random simulation methods.

Figure 2:
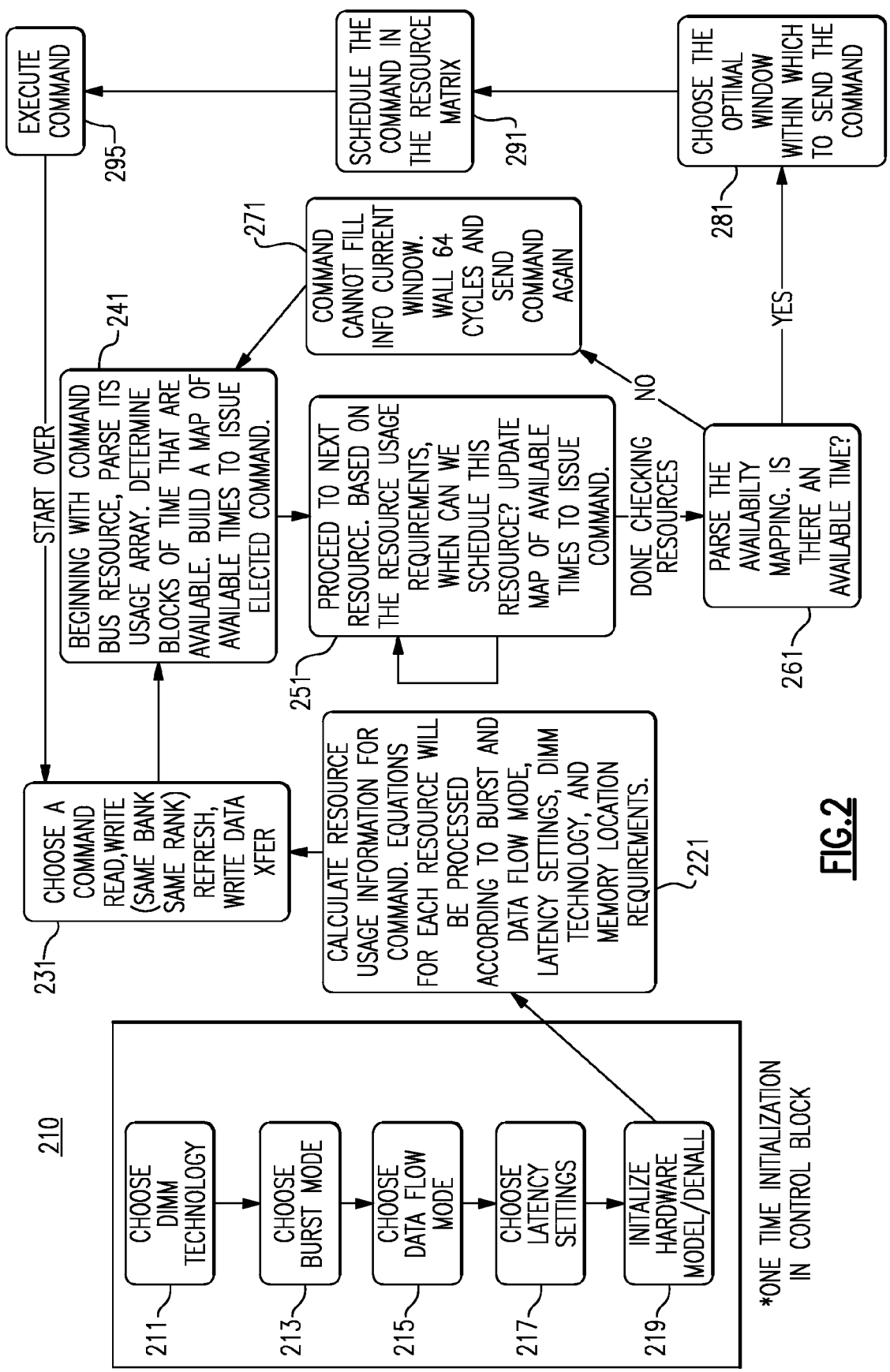
FIG. 2 illustrates one example of high level implementation of a resource scheduling algorithm that picks a unique optimal "command window" within which the randomly chosen command is inserted.

FIG. 2 illustrates a high level overview of the critical resource scheduling implementation. Specifically, the process starts with a one-time initialization in the Control Block 210. This encompasses choosing the DIMM technology 211, choosing the burst mode 213, choosing the data flow mode 215, choosing latency settings 217, and initializing the hardware model 219. One such model 219 is Denali Software Company's PCI Express.

The next step 221 is calculating the resource usage information for the commands. Equations for each resource are processed according to the initializations in the control block 210, including burst 211 and data flow 213 modes, latency settings 217, DIMM technology 211, and memory location requirements.

Block 231 illustrates the step of choosing a command, such as reading, writing (based on rank and bank) refresh, writing data, and transferring data.

Starting with the command chosen in block 231 the usage array of the command bus resource 241 is parsed. This is to determine the blocks of time that are available, and to build a map of the available times to issue the elected command.

The output of this determination 241 is used to proceed to Next Resource 251. In Next Resource 251 where the determination of resource scheduling is made, based on resource usage requirements. The map of available times to issue commands is updated.

After all of the resources are checked, the Availability Mapping is parsed to determine if there is available time 261. If the command can not fit into the current window, a wait is issued 271 and control is returned to block 231 to send the command again. If, however, there is available time 261 the optimal window within which to send the command is chosen 281. The command is then scheduled in the Resource Matrix 291, and the command is executed 295 and control returned to block 231 to start over for the next command.

Figure 3:
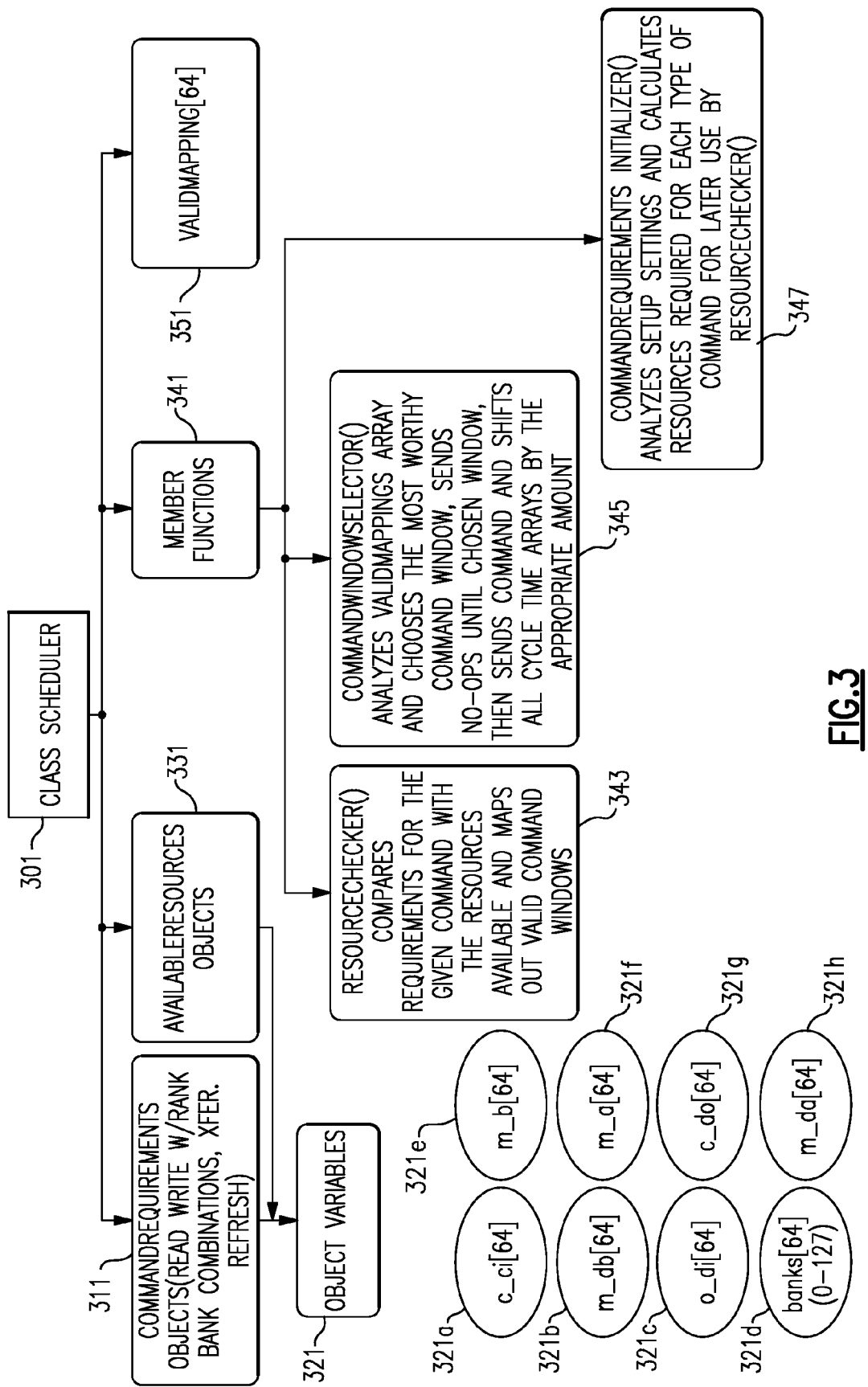
FIG. 3 illustrates one example of a functional implementation of a simulation engine that produces highly optimized input stimuli to the test model.

FIG. 3 illustrates a further aspect of critical resource scheduling. The Class Scheduler 301 includes a set of Command Requirements Objects 311 with Object Variables 321 and Variable Resources Objects 331. The Object Variables 321 include cci[64] 321a, m_db[64] 321b, o_di[64] 321c, banks [64][1-127] 321d, m_b[64] 321e, m_a[64] 321f, c_do[64] 321g, and m_da[64] 321h.

Member Functions 341 include a resourceChecker class 343, a CommandWindowSelector class 345, and a CommandRequirementsInitialzer class 347. The resourceChecker class 343 compares requirements for the given command with the resources available and maps out valid command windows. The CommandWindowSelector class 345 analyzes the valid mappings array, choosing the most worthy command window, sends "no-Ops" until the chosen window XXXX, then sends the selected command and shifts all cycle time arrays by the appropriate amount. The CommandRequirementsInitialzer 347 analyzes setup settings and calculates the resources required for each type of command for later use by the resourceChecker 343. A validMappings class 351 stores valid mappings.

Program Product

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The invention may be implemented, for example, by having the verification method and system as a software application (as an operating system element), a dedicated processor, or a dedicated processor with dedicated code. The code executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for design verification.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++".

Additionally, the program code may, for example, be compressed, encrypted, or both, and may include executable files, script files and wizards for installation, as in Zip files and cab files. As used herein the term machine-readable instructions or code residing in or on signal-bearing media include all of the above means of delivery.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for generating and monitoring valid random input stimulus sequences for a logic circuit model comprising:
   a. a logic circuit which is initialized in one of a plurality of modes comprising one of choosing DIMM technology, choosing burst mode, choosing data flow mode, choosing latency setting, and initializing a hardware model of said logic circuit;
   b. an array containing an array representation of critical resource requirements, said array representing a single simulation cycle;
   c. said array also enumerating and generating an array representation of critical availabilities, said array representing a single simulation cycle;
   d. a stored matrix of a plurality of possible combinations of input stimulus sequences, weighting input sequences, wherein selecting input stimulus sequences are selected and legal times for execution of said stimulus sequences determined based on resource availability and statistically biasing input sequence execution times to provide a biased probability distribution;
   e. logic for parsing resource availability of a command for an available time to execute the command, and if there is no available time for executing the command, for pausing and resending the command, and if there is an available time, for selecting an optimal window and sending the command;
   f. logic for monitoring the critical resources to bias the input stream such that maximum utilization of all functional units within the pipeline occurs without overflow, averting delay associated with pipeline stall; and
   g. logic for applying the input stimulus sequence to the logic circuit model.

2. The system of claim 1 wherein said stored matrix enables generating a plurality of possible combinations of input stimulus sequences.

3. A program product for generating and monitoring valid random input stimulus sequences for a logic circuit model in a computer system comprising:

computer readable computer code sequences stored on a computer readable medium for a. Initializing a logic circuit which is initialized in one of a plurality of modes comprising one of choosing DIMM technology, choosing burst mode, choosing data flow mode, choosing latency setting, and initializing a hardware model of said logic circuit;

b. creating an array containing an array representation of critical resource requirements, said array representing a single simulation cycle;

c. enumerating and generating an array representation of critical availabilities, said array representation of critical availabilities representing a single simulation cycle;

d. accessing a stored matrix of a plurality of possible combinations of input stimulus sequences, weighting input sequences, wherein selecting input stimulus sequences are selected and legal times for execution of said stimulus sequences determined based on resource availability and statistically biasing input sequence execution times to provide a biased probability distribution;

e. parsing resource availability of a command for an available time to execute the command, and if there is no available time for executing the command, for pausing and resending the command, and if there is an available time, for selecting an optimal window and sending the command;

f. monitoring the critical resources to bias the input stream such that maximum utilization of all functional units within the pipeline occurs without overflow, averting delay associated with pipeline stall; and g. applying the input stimulus sequence to the logic circuit model.

4. The program product of claim 3 wherein said stored matrix enables generating a plurality of possible combinations of input stimulus sequences.

* * * * *